United States Patent [19]

Berting et al.

[11] 4,393,379

[45] Jul. 12, 1983

[54] NON-MULTIPLEXED LCD DRIVE CIRCUIT

[76] Inventors: John P. Berting, 13 Fleetwood Rd., Newark, N.J. 07106; James K. Kroeger, 319 Radel Ter., South Orange, N.J. 07079

[21] Appl. No.: 243,973

[22] Filed: Dec. 31, 1980

[51] Int. Cl.³ .............................................. G09G 3/36
[52] U.S. Cl. ................................... 340/784; 340/765; 340/800; 340/805
[58] Field of Search ............... 340/784, 805, 792, 800, 340/801, 765

[56] References Cited

U.S. PATENT DOCUMENTS

| | | | |
|---|---|---|---|
| 3,432,846 | 3/1969 | Jones et al. | 340/792 |
| 3,895,372 | 7/1975 | Kaji et al. | 340/784 |
| 3,911,421 | 10/1975 | Alt et al. | 340/784 |
| 4,180,813 | 12/1979 | Yoneda | 340/784 |
| 4,236,155 | 11/1980 | Nagata | 340/784 |
| 4,250,503 | 2/1981 | Shanks | 340/805 |
| 4,278,974 | 7/1981 | Kondo | 340/784 |

Primary Examiner—Marshall M. Curtis

Attorney, Agent, or Firm—Lowe, King, Price & Becker

[57] ABSTRACT

A liquid crystal display circuit (9) comprises a recirculating shift register (14) having serial input and output terminals for receiving and generating binary data in bit serial format and a plurality of intermediate parallel output terminals for coupling display data to a liquid crystal display (LCD) (10). Display data are loaded into the shift register (14) during a display update mode and recirculated for display by the LCD (10) during a data refresh mode. Loading and recirculation of display data are controlled by logic circuitry (16) in a feedback loop (15, 17) of the recirculating shift register (14). To minimize DC buildup on the LCD (10), data inversion provided in the feedback loop causes periodic polarity reversal of data during recirculation. In addition, a shift register reset circuit (28) monitors the continuity of data being supplied to the LCD (10) for display. The reset circuit (28) resets the shift register (14) in response to discontinuities in input data flow to further minimize DC buildup.

7 Claims, 3 Drawing Figures

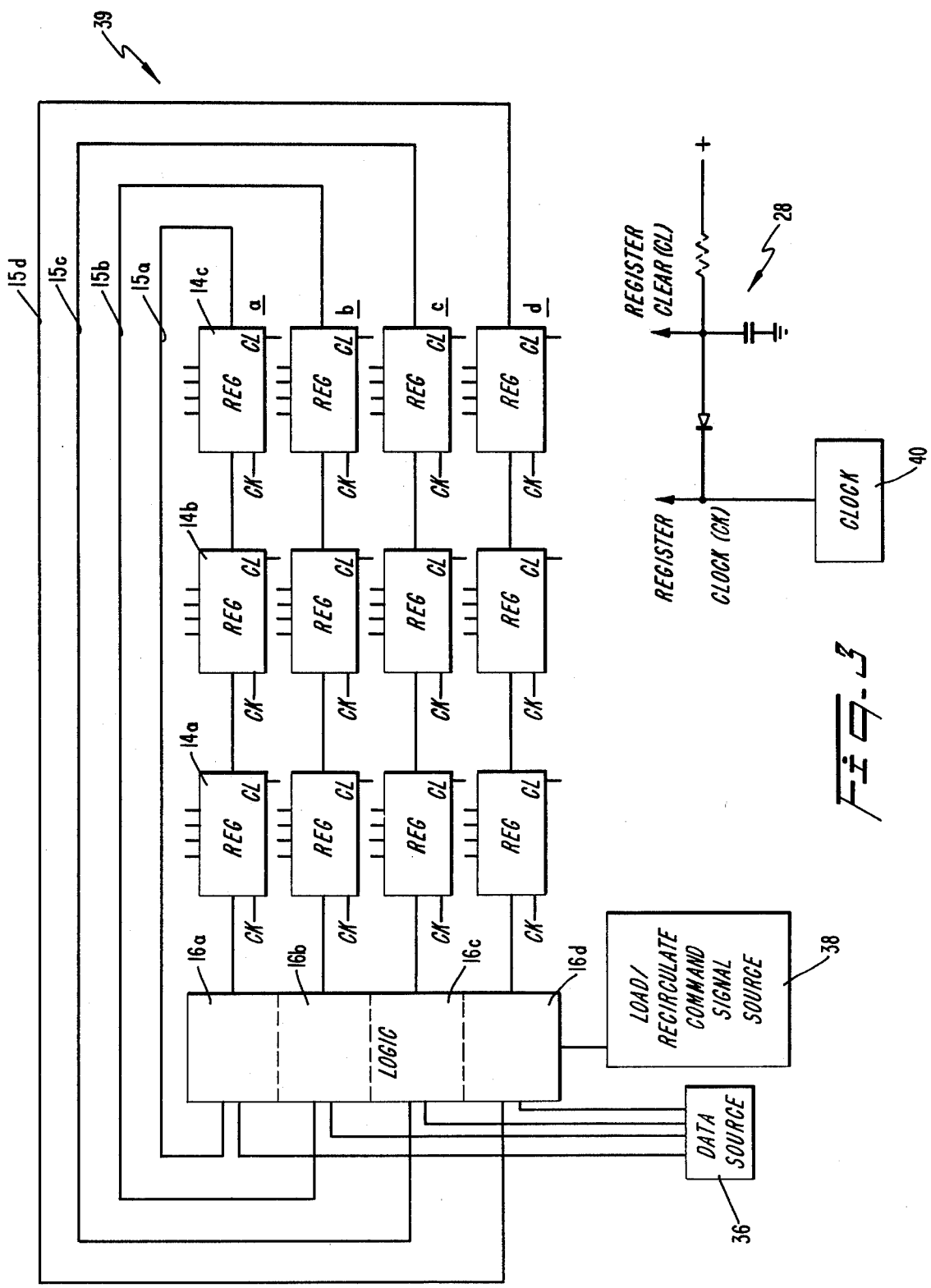

NON-MULTIPLEXED LCD DRIVE CIRCUIT

TECHNICAL FIELD

The present invention relates generally to liquid crystal display (LCD) drive circuitry, and more particularly, toward non-multiplexed LCD driver circuitry having data update and refresh capabilities.

BACKGROUND ART

Liquid crystal displays are formed of a nonisotropic liquid which is birefringent and exhibits interference patterns in polarized light; this behavior results from the orientation of molecules parallel to each other in large clusters. Liquid crystal displays (LCDs) are constructed as a common back plane electrode and a series of segment electrodes formed of transparent conductors. Depending upon the magnitude of voltage applied between the back plane conductor and individual segment conductors, characters are formed by light reflected from the particular segments upon which the display voltage is applied. Because LCD devices have a very high internal impedance, the current drawn by the devices is very small making LCDs desirable for battery operated instrumentation. There is, however, a tendency for the transparent conductors to become obscured as a result of molecular migration caused during application of a sustained DC voltage. LCD devices are thus typically operated using an AC applied voltage rather than a sustained DC voltage.

In prior art non-multiplexed LCD drive systems, the AC drive signal is generated using parallel inversion provided by multiple Exclusive Or gates or data selectors. This, however, is a very hardware intensive system and becomes costly as the number of driven lines increases. A recently developed solution to this parallel drive problem involves LCD multiplexing to substantially reduce the number of lines to be driven. There has, however, been a concomitant increase in the complexity of driving those lines. For example, multiple voltages must be used at the output of the drive, and these voltages must be controlled to change with temperature in proportion to the LCD threshhold voltage. Furthermore, multiplexing requires the LCDs to respond much more quickly to changing input voltage, and to have a substantially smaller and better defined region of on-off uncertainty than in the parallel drive approach. These factors increase the cost of the drivers and LCD, making it cost effective in only large systems.

One object of the present invention, therefore, is to provide an LCD drive circuit having reduced complexity compared to that of conventional, multiplexed LCD drive circuits.

Another object is to provide an LCD drive circuit using a minimum number of components independent of the number of driven lines in the system.

Another object is to provide an LCD drive system that prevents damage to the LCD that would tend to occur by prolonged application of DC voltage.

Yet another object of the invention is to provide a low cost LCD drive circuit that is suitable for instrumentation applications.

DISCLOSURE OF INVENTION

A liquid crystal display (LCD) drive circuit, in accordance with the invention, comprises a recirculating shift register having serial input and output terminals and a plurality of intermediate, parallel output terminals connected to drive the LCD. Data to be displayed by the LCD are loaded into the shift register at the serial input terminal, and the data are shifted through the output terminals by clock pulses. A feedback loop recirculates the output data to create a sustained image of the data on the LCD. The displayed data are periodically updated by loading new data into the shift register at the serial input terminal.

Operation of the shift register between a display data update mode, wherein new data are loaded into the shift register, and a data refresh mode, wherein the contents of the register are recirculated, is controlled by a switching circuit in the feedback loop of the register. During refresh, the feedback loop is closed with output data being recirculated to the input of the shift register at a rate depending upon the clock frequency. During the display data update mode, however, the switching circuit opens the feedback loop and supplies new data to the serial input terminal of the shift register for updating; thereafter, the refresh mode of operation is continued for data display.

To minimize DC buildup on the LCD, data inversion is provided in the feedback loop of the recirculating shift register. Thus, the contents of the shift register are polarity inverted during each recirculation pass, to prevent the tendency of molecular migration within the display. A reset circuit monitors the continuity of input data to further minimize degradation of the display by resetting the shift register in response to substantial input data interruptions.

Still other objects and advantages of the present invention will become readily apparent to those skilled in this art from the following detailed description, wherein we have shown and described only the preferred embodiment of the invention, simply by way of illustration of the best mode contemplated by us of carrying out our invention. As will be realized, the invention is capable of different embodiments, and its several details are capable of modifications in various obvious respects, all without departing from the invention. Accordingly, the drawings and description are to be regarded as illustrative in nature, and not as restrictive.

BRIEF DESCRIPTION OF THE DRAWINGS

FIG. 3 is a circuit diagram of the LCD driver circuit of FIG. 1 adapted for driving a 48 line LCD.

BEST MODE FOR CARRYING OUT THE INVENTION

Figure 1:
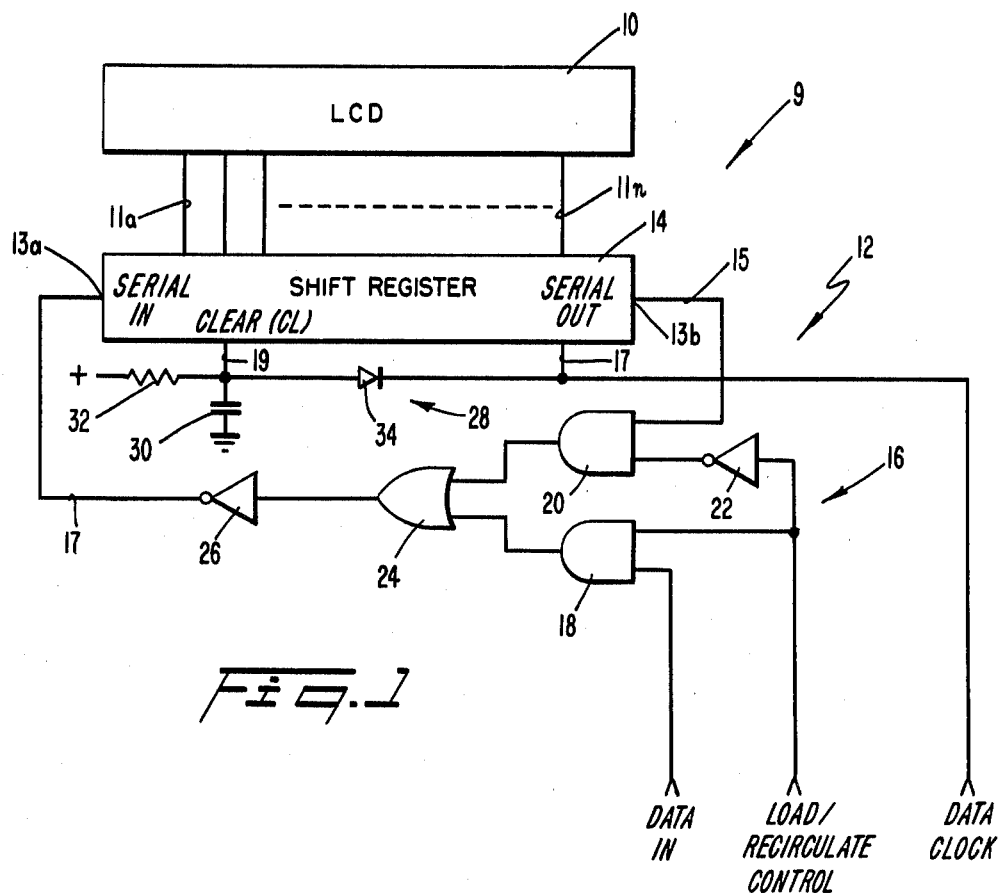
FIG. 1 is a circuit diagram of an LCD driven circuit in accordance with the invention.

Referring to FIG. 1, a non-multiplexed, LCD system 9 in accordance with the invention, comprises a conventional LCD 10 driven in bit parallel format by the parallel output terminals of a shift register 14. Shift register 14 is of a conventional type having a number of parallel output terminals 11 corresponding to the number of LCD electrical lines to be driven. The shift register 14 could, for example, comprise a number of tandomly connected four bit static shift registers such as the MC 14015B, manufactured by Motorola. The shift register 14 is provided with, in addition to the parallel output lines $11_1$–$11_n$, a serial input terminal 13a and a serial output terminal 13b. Data are loaded in bit serial format into the shift register at the serial input terminal 13a to be shifted to serial output terminal 13b by clock pulses applied to STROBE terminal 17. The contents of the shift register 14 are reset or cleared by application of a logic zero signal to CLEAR terminal 19.

The data developed at the output 13b of shift register 14 are recirculated to the input 13a by a feedback loop comprising electrical lines 15 and 17. A switching circuit 16 in the feedback loop selectively couples data at output terminal 13b to the input terminal 13a for recirculation or couples update data to the serial input terminal of the shift register. Thus, depending upon the state of switching circuit 16, either data stored in register 14 are recirculated to refresh the LCD display or update data are loaded into the register for subsequent refresh and display.

Considering switching circuit 16 in more detail, the circuit comprises a pair of AND gates 18 and 20 having outputs supplied to an OR gate 24. The output of the OR gate 24 is supplied, through an inverter 26, to input terminal 13a of shift register 14. Update data to be loaded into shift register 14 are applied to one input of AND gate 18. A load/recirculate control signal is applied to the second input of gate 18 as well as to one input of AND gate 20 through an inverter 22. The second input of AND gate 20 receives data developed at the output 13b of register 14.

During data update, the load/recirculate control line of switching circuit 16 is maintained at a logic one level by application thereto of a logic one control signal. This logic one control signal enables AND gate 18 to pass input data to OR gate 24 and then through inverter 26 to the serial input terminal 13a of shift register 14. AND gate 20 is maintained disabled by a logic zero signal developed by the logic one data update control signal following inversion in inverter 22.

During data recirculation, however, the load/recirculate control terminal is maintained at logic zero. This logic zero signal disables AND gate 18 and through inverter 22 enables AND gate 20 to pass data at the output terminal 13b of the register 14 to the OR gate 24 and then through inverter 26 to input terminal 13a. It is pointed out that during each recirculation pass of data through switching circuit 16, there is a data inversion at inverter 26. This data inversion causes corresponding polarity reversal of the voltage applied to LCD 10 to prevent application of prolonged DC voltage thereto and thereby minimize deterioration of the LCD.

To further minimize LCD deterioration, a reset circuit 28 monitors the flow of incoming data, and in response to an interruption in incoming data for a time duration greater than a predetermined duration, clears or resets the contents of shift register 14. This eliminates any tendency of the LCD 10 to become DC excited in the absence of incoming data to update the display.

More specifically, the reset circuit 28 comprises an RC network including a resistor 32 having one terminal connected to a positive supply source (+) and the remaining terminal connected to one terminal of a grounded capacitor 30 as well as to the anode of a diode 34 and to CLEAR terminal 19 of shift register 14. The cathode of diode 28 is connected to receive data clock pulses applied to STROBE terminal 17 of the shift register 14. The CLEAR terminal of shift register 14 is normally maintained at a logic zero level during data transfer within the register. The register 14 is cleared by application of a logic one level signal to the CLEAR terminal 19.

Figure 2:
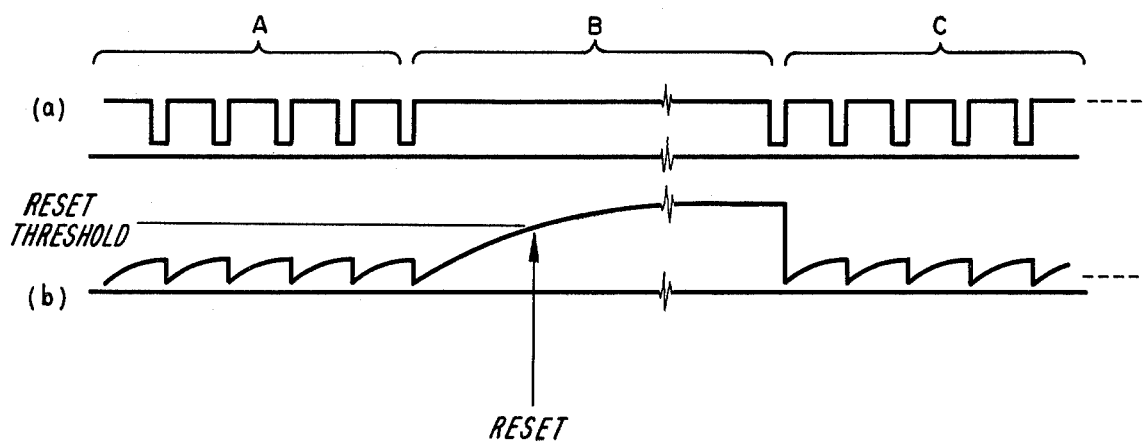
FIGS. 2(a) and 2(b) are waveforms for explaining the operation of the register reset circuit of FIG. 1.

Thus, referring to FIGS. 2(a) and 2(b), a normal flow of incoming data is accompanied by clock pulses P synchronized to the data. These pulses P are applied to STROBE terminal 17 of register 14 and to the cathode of diode 34. Portion A of FIG. 2(a) represents normal continuous incoming data flow. The portion B of the FIG. 2(a) represents an interruption in incoming data flow and portion C represents a resumption of incoming data.

With reference to FIG. 2(b), the waveform Q is the resultant voltage at the anode of diode 34 applied to CLEAR terminal 19 of register 14. During normal incoming data flow, the capacitor 30 is discharged by the clock pulses P to maintain the ripple-like voltage Q at a level below the reset threshold level $V_{th}$ of the register 14. During data flow interruption, however, capacitor 30 charges through resistor 32, as shown in waveform region B, until the capacitor voltage goes above the reset threshold voltage $V_{th}$. When capacitor voltage Q goes above the reset threshold voltage $V_{th}$, as indicated by the arrow in FIG. 2(b), the contents of the shift register 14 are cleared (reset). Thereafter, upon resumption of incoming data in waveform portion C, the capacitor 30 discharges to a level below the reset threshold level $V_{th}$ enabling register 14 to receive and shift data in a normal manner. The charge rate of capacitor 30 depends on the time constant of the RC circuit. The time constant is selected in accordance with the duration of data flow interruption to which reset circuit 28 is designed to be responsive.

Referring now to FIG. 3, the principles of the invention shown in FIG. 1 are applied to drive a 48 line LCD (not shown). LCD drive circuit 39 thus comprises three tandemly connected, four-bit static shift registers 14a–14c in each of four parallel data flow paths a–d together with four switching circuits 16a–16d within the data recirculation feedback loop 15a–15d of the four sets of tandem registers 14a–14c. The twelve registers 14a–14c within paths a–d may be provided by six dual four-bit static shift register modules such as the Motorola MC 14015B; switching circuits 16a–16d may be provided by a Motorola MC 14519B four bit AND/OR selector, containing sufficient gating elements to provide all four parallel circuits 16a–16d of the type identified by the numeral 16 in FIG. 1.

Data source 36 for supplying update data to be loaded into shift register 14a–14c as well as load/recirculate command signal source 38 may be provided by a conventional microprocessor (not shown). Similarly, a clock source 40 for strobing registers 14a–14c and controlling reset circuit 28 may be provided by the microprocessor. For example, in a portable, microprocessor-controlled multitester using a 50 Hz AC drive, a sufficient number of clock pulses are applied to shift registers 14a–14c to completely recirculate data in the shift registers one time. In this example, assuming a 12 bit data sequence repeated at 10 millisecond intervals, 12 bits of data are shifted into each set of three four-bit shift registers 14a–14c in each parallel data path a–d during each 10 millisecond interval. The 12 bits of data are recirculated at the 50 Hz rate to provide normal display refresh of the LCD. Periodically, display data are updated by a new measurement obtained by the multitester, and the load/recirculate command signal source 38 controls the logic network 16a–16d in the manner discussed supra to load the new data into shift registers 14a–14c rather than to recirculate stored data. Following data loading, the command signal source 38 controls the network 16 to resume data recirculation for continued display refresh.

In this disclosure there is shown and described only the preferred embodiment of the invention, but as aforementioned, it is to be understood that the invention is capable of use in various other combinations and environments and is capable of changes or modifications within the scope of the inventive concept as expressed therein.

We claim:

1. A liquid crystal display (LCD) drive circuit using recirculating shift register means for generating bit parallel output data to be applied to an LCD for display as a stationary image by repetitively recirculating a number of bits corresponding to a number of stages of said register means and, upon completion of each recirculation of bits, transferring the contents of said register means to said LCD, the drive circuit comprising display update means for loading display data into said shift register means, display refresh means including data inversion means for recirculating data stored in said shift register means, switch means for selectively operating said update and refresh means, clock means for shifting data stored in said shift register means and means synchronized to the clock means for transferring the bit parallel data from said shift register to be displayed as a stationary image on said LCD.

2. A liquid crystal display (LCD) drive circuit using a recirculating shift register having a serial input terminal, a serial output terminal and a plurality of intermediate, parallel output terminals, said parallel output terminals being coupled to an LCD, said shift register means being controlled by said drive circuit to repetitively recirculate a number of bits corresponding to a number of stages of said register means and, upon completion of each recirculation of bits, transferring the contents of said register means to said LCD, the drive circuit comprising switch means for selectively (1) updating said LCD by applying display data to said serial input terminal to load said shift register and (2) refreshing said LCD by coupling together said input and output terminals of said shift register for recirculation and inversion of loaded data; clock means for shifting data in said shift register; and means synchronized to said clock means for transferring bit parallel data from said shift register to be displayed as a stationary image on said LCD.

3. A liquid crystal display (LCD) circuit comprising an LCD for visually displaying data applied thereto; recirculating shift register means for generating bit parallel output data to be applied to said LCD for display as a stationary image by repetitively recirculating a number of bits corresponding to a number of stages of said register means and, upon completion of each recirculation of bits, transferring the contents of said register means to said LCD, the drive circuit comprising display update means for serially loading display data into said shift register means; display refresh means for recirculating and inverting data stored in said shift register means, switch means for selectively operating said update and display means; clock means for shifting data stored in said register; and means synchronized to said clock means for transferring the bit parallel output data from the shift register to be displayed as a stationary image on the LCD.

4. The circuit of claim 1, 2, or 3, wherein said shift register means includes a data recirculation feedback loop, said switch means being connected in said feedback loop to selectively supply to said register input display data and recirculation display data.

5. The circuit of claim 1, 2, or 3, including means responsive to input display data for clearing contents of said shift register means during input data interruptions of time durations greater than a predetermined duration.

6. The circuit of claim 6, wherein said shift register means includes a CLEAR terminal, and said clearing means includes an R-C circuit coupled to said CLEAR terminal and to a source of input data.

7. The circuit of claim 1, 2, or 3, wherein said switch means includes binary gate means having inputs connected respectively to an input data source and to the serial output of said shift register means and an output connected to the serial input of said shift register means, and a control input for selectively transferring data at said first and second gate inputs to said gate output.

* * * * *

UNITED STATES PATENT AND TRADEMARK OFFICE
CERTIFICATE OF CORRECTION

PATENT NO. : 4,393,379
DATED : July 12, 1983
INVENTOR(S) : John P. Berting et al.

It is certified that error appears in the above-identified patent and that said Letters Patent is hereby corrected as shown below:

On the title page insert:

-- /73/ Assignee: Sangamo Weston, Inc.
Atlanta, GA 30362 --.

Column 3, line 62, "diode 28" should read -- diode 34 --.

Claim 6, column 6, line 32, "claim 6" should read
-- claim 5 --.

Signed and Sealed this

Twenty-second Day of November 1983

[SEAL]

Attest:

GERALD J. MOSSINGHOFF

Attesting Officer

Commissioner of Patents and Trademarks